(12) United States Patent
Ogura

(10) Patent No.: US 6,316,337 B1
(45) Date of Patent: Nov. 13, 2001

(54) PRODUCTION PROCESS OF SOI SUBSTRATE

(75) Inventor: Atsushi Ogura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/158,194

(22) Filed: Sep. 21, 1998

(30) Foreign Application Priority Data

Sep. 24, 1997 (JP) .................................................. 9-274978

(51) Int. Cl.⁷ .................................................. H01L 21/20
(52) U.S. Cl. .......................................... 438/480; 438/471
(58) Field of Search .................................. 438/471, 480, 438/52, 62

(56) References Cited

U.S. PATENT DOCUMENTS

| | | | |
|---|---|---|---|
| 5,436,175 | * 7/1995 | Nakato et al. | 437/24 |
| 5,543,351 | * 8/1996 | Hirai et al. | 437/63 |
| 5,589,407 | * 12/1996 | Meyyappart et al. | 437/26 |
| 5,610,087 | * 3/1997 | Hsu et al. | 437/32 |
| 5,670,411 | * 9/1997 | Yonehara et al. | 437/62 |
| 5,818,085 | * 10/1998 | Hsu et al. | 257/347 |
| 5,956,580 | * 9/1999 | Wu | 438/163 |
| 5,968,840 | * 10/1999 | Park et al. | 437/52 |
| 5,970,366 | * 10/1999 | Okonogi | 438/471 |

FOREIGN PATENT DOCUMENTS

| | | |
|---|---|---|
| 63-27063 | 2/1988 | (JP) . |
| 4-343248 | 11/1992 | (JP) . |
| 5-121347 | 5/1993 | (JP) . |
| 6-283420 | 10/1994 | (JP) . |
| 9-64372 | 3/1997 | (JP) . |

OTHER PUBLICATIONS

M. Meyyappen, "A Novel Approach for SIMOX wafer cost reduction" Oct. 5–7 IEEE Intl. SOI Conference 1993 pp. 1–3.*

H. Kogaku, Semiconductor Silicon Crystal Engineering Sep. 1993 p. 223.*

* cited by examiner

*Primary Examiner*—Joni Chang
*Assistant Examiner*—Granvill D Lee
(74) *Attorney, Agent, or Firm*—Hutchins, Wheeler & Dittmar

(57) ABSTRACT

After $O_2^+$ ions are implanted in a silicon substrate (10), heat treatment is applied to the silicon substrate at a temperature of from 1,200° C. to 1,410° C., both inclusive, in an atmosphere having an oxygen content of from 0.1% to 1%, both inclusive, whereby a buried oxide layer (50) is formed. Subsequent to the above heat treatment, post heat treatment may be applied to the silicon substrate (10) at a temperature of from 1,200° C. to 1,410° C., both inclusive, in an atmosphere having an oxygen content of from 1% to 30%, both inclusive. Further, prior to the heat treatment, provisional heat treatment may be applied to the silicon substrate 10 at a temperature of form 350° C. to 1,000° C., both inclusive, for 1 hour or longer.

3 Claims, 5 Drawing Sheets

O₂ + ION IMPLANTATION

O+ ION IMPLANTATION

O+ ION IMPLANTATION
($3 \times 10^{17}/cm^2$)

PRODUCTION PROCESS OF SOI SUBSTRATE

BACKGROUND OF THE INVENTION

1. Field of the Invention

This invention relates to a production process of an SOI (Si on Insulator) substrate, which has a promising prospect as a substrate material for next-generation LSIs and carries a semiconductor layer on an insulator.

2. Description of the Prior Art

As a process for forming on an insulator an SOI structure having a semiconductor active layer therein, there is the SIMOX (Separation by Implanted Oxygen) process as disclosed, for example, in J. Mater. Res., 8(3), 523–534 (1993), in which $O^+$ ions are implanted at a high dose in an Si substrate, followed by heat treatment at elevated temperature so that a continuous oxide film ($SiO_2$ film) is formed inside the substrate.

This process, while permitting rather easy provision of an SOI substrate, is accompanied by a drawback in that crystal defects remain in an upper Si active layer which is a device-forming region. The density of residual crystal defects depends upon the dose of implanted oxygen ions, so that a high dose leads to many residual crystal defects compared with a low dose. For a reduction in crystal defects, it is therefore necessary to control the dose of implanted oxygen ions low. From the viewpoint of achieving a reduction in production cost, a low dose is also desired as the time for ion implantation can be shortened. However, when oxygen ions are implanted at a low dose of $3.5 \times 10^{17}$ ions/cm$^2$ or lower and 180 KeV, for example, the subsequent high-temperature heat treatment cannot form any continuous oxide film but results in the formation of paths for current leakage, thereby failing to obtain good device characteristics.

Namely, the SIMOX process has the demerit that crystal defects remain in an upper Si active layer which is a region where devices are formed, although it has the merit that an SOI substrate can be obtained rather easily. Further, the implantation of oxygen ions at a low dose with a view to reducing crystal defects and production cost is accompanied by the drawback that the subsequent high-temperature heat treatment cannot form any continuous oxide film but results in the formation of paths for current leakage, thereby failing to obtain good device characteristics.

An object of the present invention is to overcome the above-described problems of SIMOX and to provide a production process for obtaining at low cost an SIMOX substrate with reduced crystal defects.

SUMMARY OF THE INVENTION

According to the present invention which has attained the above-described object, there is provided a process for the production of an SOI (Si on Insulator) substrate, including a step of forming a buried silicon oxide layer by oxygen ion implantation, which comprises the following steps: implanting $O_2^+$ ions in a silicon substrate and subjecting the thus-implanted silicon substrate to heat treatment at a temperature of from 1,200° C. to 1,410° C., both inclusive, in an atmosphere having an oxygen content of from 0.1% to 1%, both inclusive.

A description will hereinafter be made about reasons for which the present invention has made it possible to form a continuous oxide film even at a low dose and hence to produce at low cost an SIMOX substrate with reduced crystal defects.

At first, the present inventors studied in detail the mechanism of formation of an SOI structure by the conventional SIMOX process. As a result, it has been confirmed that the setting of acceleration energy and a dose at 180 KeV and about $1.2 \times 10^{18}$ ions/cm$^2$ or higher as ion implantation conditions leads to the formation of a continuous oxide film even in a form shortly after the ion implantation and the subsequent high-temperature heat treatment results in further gathering of surrounding oxygen atoms to form a SOI structure. It has also been corroborated that at a low dose falling below $1.2 \times 10^{18}$ ions/cm$^2$, on the other hand, oxide islets exist scattering in an initial stage of heat treatment after ion implantation, continuation of the heat treatment results in growth of some of the oxide islets and disappearance of some of the oxide islets, and combinations of the thus-grown oxide islets themselves leads to the formation of a continuous oxide film.

According to a further detailed investigation, it has been found that, when heat treatment is applied subsequent to $O^+$ ion implantation, the distribution of oxide islets which existed scattering in the initial stage of the heat treatment develops two peaks at different depths from the surface. Namely, it has been confirmed that the position of the shallower peak coincides with the position of a disruption peak at which Si crystals have been disrupted most severely by the ion implantation and the position of the deeper peak coincides with the position of a peak at which the concentration of ion-implanted oxygen is highest. It has also been corroborated that, when the heat treatment is continued further, the oxide islets at the disruption peak disappear and the oxide at the concentration peak grows to form a buried continuous oxide film at the position of the concentration peak but that in the course of the formation of the buried continuous oxide film, crystal defects occur connecting the oxide islets at the position of the damage peak with the oxide islets at the position of the concentration peak. It has also been confirmed that these crystal defects remain even after the disappearance of the oxide islets at the position of the disruption peak and that the residual crystal defects occurred as described above amount to a large majority of crystal defects remaining in an SIMOX substrate. Further, it has also been found that, when the oxide islets disappear at the position of the disruption peak, some oxygen diffuses out of the substrate from a surface thereof. It has hence become evident that the implanted oxygen is not effectively utilized in its entirety for the formation of the buried oxide film.

As mentioned above, drawbacks such as the occurrence of crystal defects and an increased ion implantation cost due to the non-efficient utilization of implanted oxygen are attributed to the oxide islets formed at the position of the damage peak. The process in which oxygen contained in Si crystals is caused to become oxide islets by the heat treatment is promoted as the oxygen concentration increases and also as the disruption of crystals becomes severer. In the case of the formation of oxide islets in the above-mentioned SIMOX process, for example, the formation of oxide islets is promoted due to the considerable disruption of crystals although the concentration of oxygen is low there. At the position of the concentration peak, on the other hand, the formation of oxide islets is also promoted due to a high oxygen concentration although the disruption of crystals is slight there.

Here, the present inventors have found that the distribution of disruption to crystals upon implantation of ions in Si crystals varies depending on the mass of the implanted ions. When ions having a lighter mass than Si atoms, like $O^+$ ions, are implanted in Si crystals, a disruption peak occurs at a position shallower than the concentration peak of implanted ions. When $O_2^+$ ions are implanted, on the other hand, a disruption peak substantially coincides with a concentration peak or a disruption peak occurs at a position slightly deeper than a concentration peak. This can be attributed to the fact that the mass number of an $O_2$ molecule is 32 which is a value close to 28, the mass number of Si. Accordingly, when $O_2^+$ ion implantation is conducted instead of conventional $O^+$ ion implantation, the introduction of crystal defects is reduced and, even if crystal defects occur, they are formed at a position deeper than an embedded oxide film so that no deleterious effect is applied to an active surface layer where devices are to be formed. Even if oxide islets are formed at a damage peak, extra oxygen do not diffuse out from the surface upon disappearance of the oxide inlets, but are captured on oxide islets occurred from a concentration peak and existing at a shallower position. As the oxygen so captured contributes to the formation of an embedded oxide film, the implanted ions are effectively utilized substantially in their entirety.

As has been described above, the present invention has made it possible to form at low cost an SOI structure which does not contain much crystal defects and has been hardly available by the prior art.

DETAILED DESCRIPTION OF THE PREFERRED EMBODIMENTS

Figure 1A:
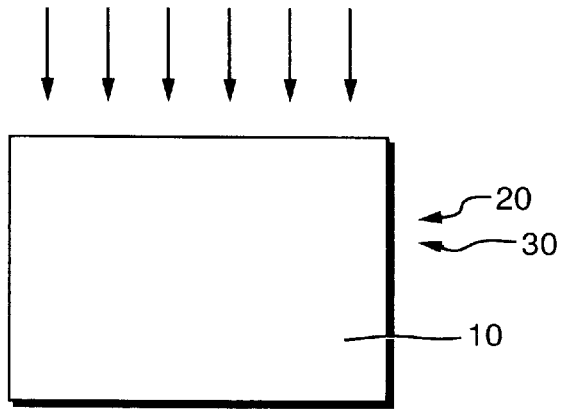
FIGS. 1A–1C are schematic cross-sectional views showing a process according the present invention for the production of an SOI substrate.

In the present invention, a conventional ion implanter is used for the implantation of $O_2^+$ ions. Acceleration energy is usually set at 40 KeV to 400 KeV, both inclusive.

The implant dose of $O_2^+$ ions is controlled at $5 \times 10^{16}$ ions/cm$^2$ to $2 \times 10^{18}$ ions/cm$^2$, both inclusive, preferably at $1 \times 10^{17}$ ions/cm$^2$ to $1 \times 10^{18}$ ions/cm$^2$, both inclusive. An implant dose greater than $2 \times 10^{18}$ ions/cm$^2$ leads to the occurrence of residual crystal defects and also to a rise in production cost due to the need for a longer ion implantation time. On the other hand, an implant dose smaller than $5 \times 10^{16}$ ions/cm$^2$ leads to a failure in forming a good oxide film.

In the present invention, heat treatment is applied to a silicon substrate subsequent to the implantation of $O_2^+$ in the silicon substrate. The temperature of this heat treatment is set at 1,200° C. to 1,410°, both inclusive, preferably at 1,280° C. to 1,390° C., both inclusive. The selection of this temperature range assures good annealing so that a buried continuous oxide film can be formed.

Further, the above heat treatment is conducted in an atmosphere which contains oxygen at a concentration of from 0.1% to 1%, both inclusive, preferably of from 0.5% to 1%, both inclusive. This makes it possible to effectively avoid disruption of an Si surface, which would otherwise occur when heat-treated at an elevated temperature. An oxygen content lower than 0.1% cannot exhibit the Si surface disruption avoiding effect, while an oxygen content higher than 1% leads to the formation of a thick oxide film on the surface. Oxygen contents outside the above range are therefore not preferred. The heat treatment time may be set generally at 3 to 5 hours although no particular limitation is imposed thereon.

In the present invention, the silicon substrate which has been heat-treated as described above may preferably be subjected to post heat treatment. This post heat treatment is conducted in an atmosphere which contains oxygen at a concentration of from 1% to 30%, both inclusive, preferably of from 10% to 20%, both inclusive. The use of such an atmosphere can bring about an improvement in the quality of the buried oxide film. An oxygen content lower than 1% cannot exhibit the above-described effect, while an oxygen content higher than 30% leads to the formation of a thick oxide layer on the surface silicon layer. Oxygen contents outside the above range are therefore not preferred. Especially when the heat treatment is applied for a long time, a problem arises in that a single crystal silicon film may be consumed up entirely.

The temperature of this post heat treatment is set at 1,200° C. to 1,410° C., both inclusive, preferably at 1,280° C. to 1,390° C. By setting the temperature of the post heat treatment within this range, the above-mentioned improving effect for the quality of an embedded oxide film can be exhibited. The time of the post heat treatment may be set generally at 1 to 5 hours although no particular limitation is imposed thereon.

In the present invention, it is preferable to apply provisional heat treatment to a silicon substrate before the heat treatment. This provisional heat treatment can promote the formation of oxide islets and hence the formation of a good buried oxide film.

Upon conducting this provisional heat treatment, the temperature may be set at 350° C. to 1,000° C., both inclusive, preferably at 450° C. to 1,000° C., both inclusive, and the time of the provisional heat treatment may be set at 1 hour to 500 hours, both inclusive. The selection of these temperature range and treatment time can bring about a marked accelerating effect for the above-mentioned formation of oxide islets.

EXAMPLE 1

Two 6-inch p-type Si(100) substrates of 1 to 10 Ω cm were provided. In one of the substrates, that is, the Si substrate 10 as shown in FIG. 1, $O_2^+$ ions were implanted to $2 \times 10^{17}$ ions/cm$^2$ with acceleration energy of 360 KeV. In this case, a concentration peak position 20 of the implanted oxygen was located extremely close to a disruption peak position 30. Then, the Si substrate 10 was subjected to heat treatment at 1,340° C. for 5 hours in an atmosphere which contained 0.5% of $O_2$ in Ar.

The incorporation of the small amount of $O_2$ in the heat treatment atmosphere is effective for the protection of an Si surface from disruption which is often observed in heat treatment at an elevated temperature.

Figure 1B:
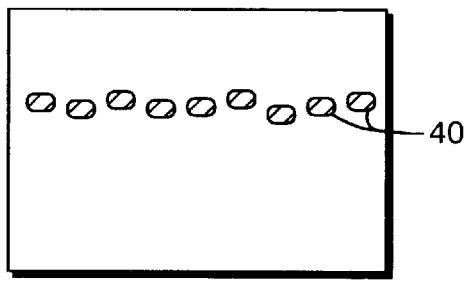
Figure 1C:
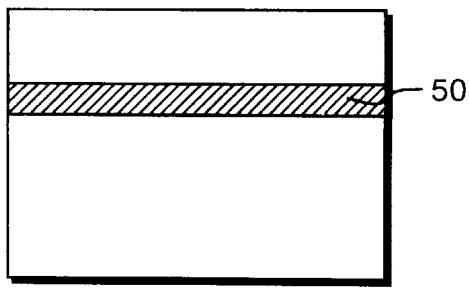

From TEM and SEM observations conducted successively through various stages of the heat treatment, it has been found that the formation of an SOI structure during the heat treatment proceeds in such a mechanism as shown in FIGS. 1B and 1C. Described specifically, oxide islets 40 were formed at substantially the same depth in an initial stage of the heat treatment as depicted in FIG. 1B. When the heat treatment was continued further, an embedded continuous oxide film 50 was formed as illustrated in FIG. 1C, whereby a good SOI structure substantially free of crystal defects in its upper Si layer was obtained.

Figure 2A:
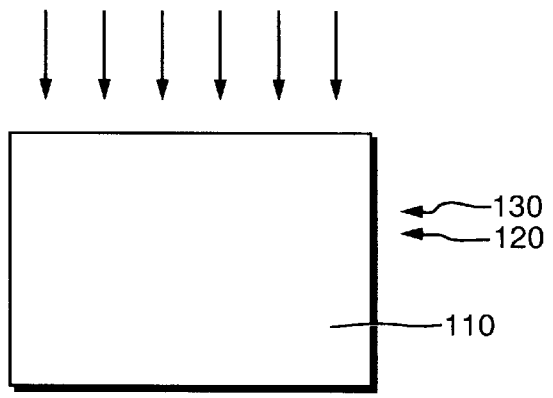
FIGS. 2A–2C are schematic cross-sectional views illustrating a conventional process for the production of an SOI substrate.
Figure 2B:
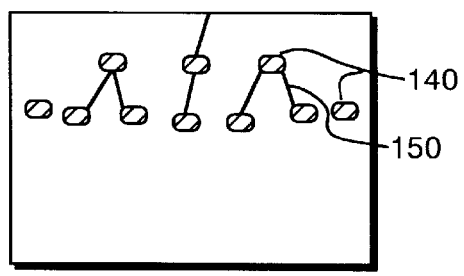
Figure 2C:
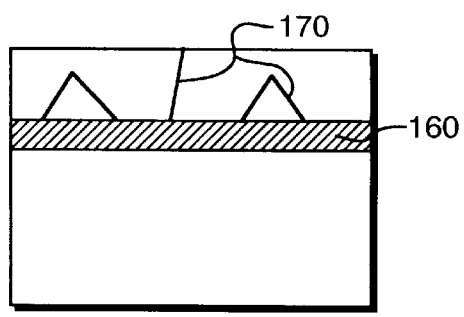
Figure 3:
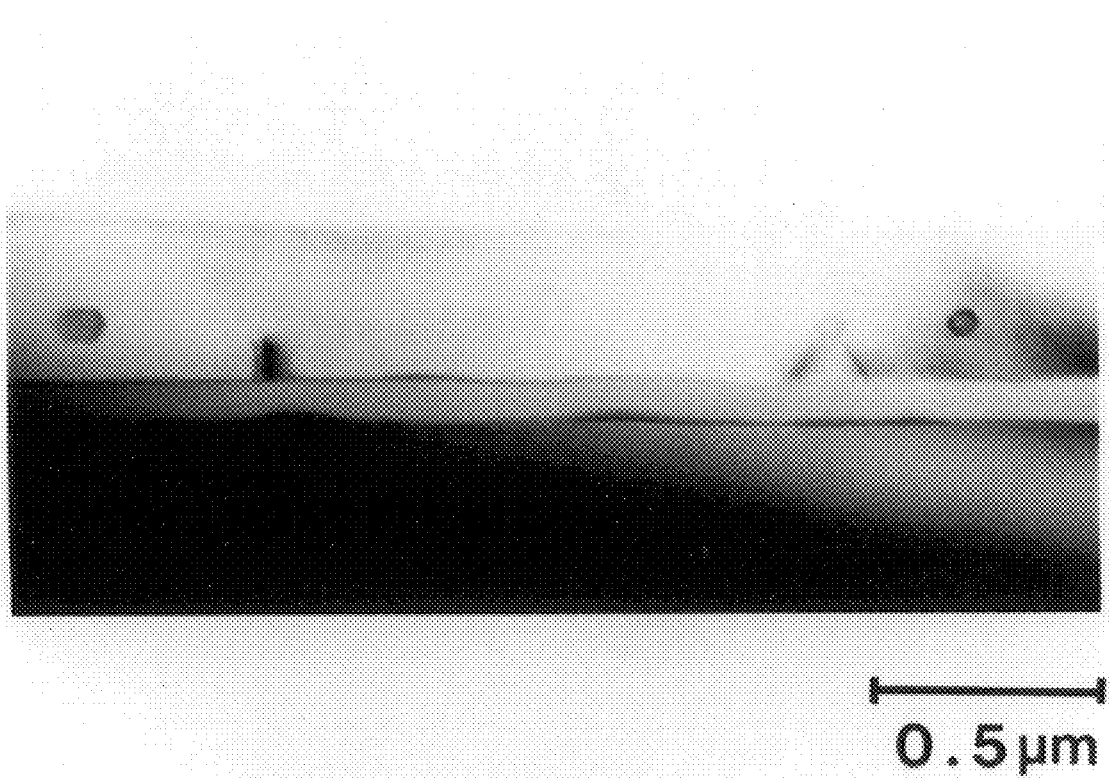
FIG. 3 is a TEM cross-section depicting crystal defects occurred when an SOI substrate was produced by the conventional production process.

As illustrated in FIG. 2, on the other hand, the formation of an SOI structure by the conventional process was also attempted for the sake of comparison. In the other Si substrate, namely, the Si substrate 110, $O^+$ ions were implanted to $4 \times 10^{17}$ ions/cm$^2$ with acceleration energy of 180 KeV. In this case, a concentration peak position 120 of the implanted oxygen appeared at a position considerably deeper than a disruption peak position 130. The conditions for the thus-conducted ion implantation were chosen so that the distribution and concentration of the oxygen introduced into the Si substrate became equal to those achieved in the $O_2^+$ ion implantation. Similarly to the preceding case, the Si substrate 110 was subjected to heat treatment at 1,340° C. for 5 hours in an atmosphere which contained 0.5% of $O_2$ in Ar. From observations conducted successively through various stages of the heat treatment, a structure was confirmed in an initial stage of the heat treatment as illustrated in FIG. 2B, namely, oxide islets 140 were formed at both a concentration peak position and a disruption peak position and the oxide islets at the concentration peak position and those at the disruption peak position were connected together via crystal defects 150. FIG. 3 is the TEM cross-section showing this structure. When the heat treatment was continued further, an embedded continuous oxide film 160 was formed as in the $O_2^+$ ion implantation. However, many crystal defects 170 remained in an upper Si layer of the resultant SOI structure (see FIG. 2C).

Figure 4:
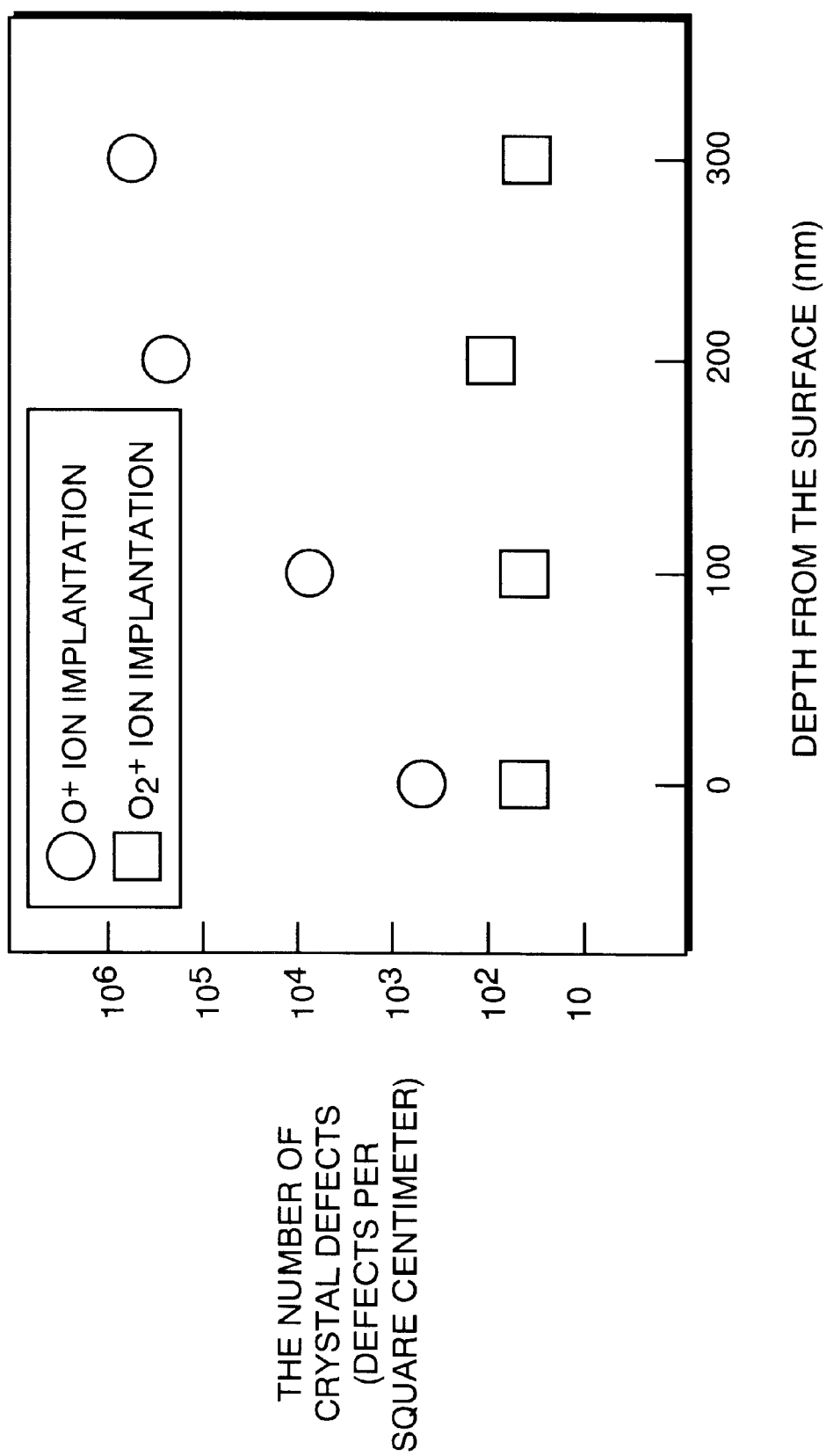
FIG. 4 is a diagram showing the results of measurements of the distributions of crystal defects in the SOI substrates produced by the process according to the present invention and the conventional process, respectively.

FIG. 4 diagrammatically illustrates the numbers and distributions of crystal defects—which remained in the upper Si layers of the SOI structures formed by the $O_2^+$ ion implantation and the $O^+$ ion implantation, respectively, as described above—in terms of the results of measurements conducted at every 100 nm distance from the surfaces. It has been confirmed that irrespective of the depth, the $O_2^+$ ion implantation resulted in fewer crystal defects than the $O^+$ ion implantation. In particular, the number of crystal defects increased with the depth from the surface in the $O^+$ ion implantation. This is believed to be attributable to influence from the oxide islets existing at the disruption peak position shown in FIG. 2B. As a matter of fact, the position of 200 nm down from the surface where the number of crystal defects notably increased substantially coincided with the position of the disruption peak. In the case of the $O_2^+$ ion implantation, on the other hand, the resulting SOI structure has been confirmed to have a substantially uniform distribution of crystal defects from the surface toward the interior of the substrate. The residual crystal defects observed in the case of $O_2^+$ ion implantation appears to be attributable to influence from certain contamination sources contained in the heat treatment atmosphere and the like, and are thus expected to be reduced by decontamination of the heat treatment atmosphere and the like.

Incidentally, the ion implantations and heat treatments described above are merely illustrative and are not intended to indicate any limitations to their conditions. For example, the heat treatment has been found to bring about similar advantageous effects even when it is conducted in an $N_2$ atmosphere.

EXAMPLE 2

As in Example 1, two 6-inch p-type Si(100) substrates of 1 to 10 Ω cm were provided. In one of the substrates, $O_2^+$ ions were implanted to $2 \times 10^{17}$ ions/cm$^2$ with acceleration energy of 360 KeV. In the other substrate, $O^+$ ions were implanted to $4 \times 10^{17}$ ions/cm$^2$ with acceleration energy of 180 KeV. The substrates were then subjected to heat treatment at 1,340° C. for 5 hours in an atmosphere which contained 0.5% of $O_2$ in Ar. The concentration of $O_2$ in Ar was raised to 20%, and the heat treatment was continued further for 5 hours. The latter heat treatment at the raised $O_2$ concentration is known to have improving effect for the quality of the embedded oxide film and, in this example, was also confirmed to be effective for the improvement of the quality of the embedded oxide film in each of the $O_2^+$ ion implantation and the $O^+$ ion implantation. Post heat treatment in an atmosphere of a high $O_2$ concentration however leads to the introduction of interstitial Si in Si crystals upon oxidation of a surface, so that many crystal defects existed in the case of the $O^+$ ion implantation captured such interstitial Si. As a result, the crystal defects were observed to grow, thereby further deteriorating the crystallinity. In the case of the $O_2^+$ ion implantation, on the other hand, crystal defects were inherently not many and, moreover, are different in kind from the crystal defects introduced abundantly by the $O^+$ ion implantation. Accordingly, no deterioration in crystallinity due to the capture of interstitial Si was confirmed.

EXAMPLE 3

Figure 5A:
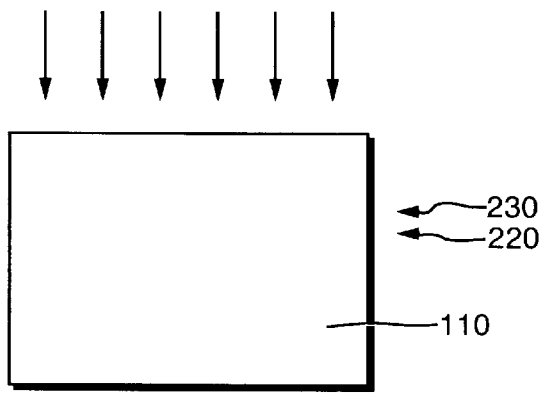
FIGS. 5A–5C are schematic cross-sectional views showing the conventional process as applied for the production of an SOI substrate having an ion dose lower than that shown in FIGS. 2A–2C.
Figure 5B:
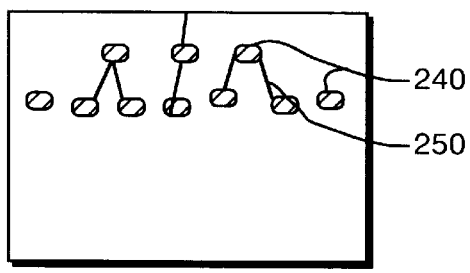
Figure 5C:
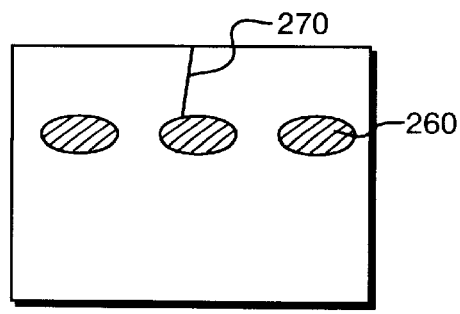

As in Example 1 and Example 2, two 6-inch p-type Si(100) substrates of 1 to 10 Ω cm were provided. In one of the substrates, $O_2^+$ ions were implanted to $1.5 \times 10^{17}$ ions/cm$^2$ with acceleration energy of 360 KeV. In the other substrate, $O^+$ ions were implanted to $3 \times 10^{17}$ ions/cm$^2$ with acceleration energy of 180 KeV. The substrates were then subjected to heat treatment at 1,340° C. for 5 hours in an atmosphere which contained 0.5% of $O_2$ in Ar. The total amount of oxygen introduced in Si was the same in both the cases but, as described above under the Description of the Prior Art, the conventional $O^+$ ion implantation was unable to provide an SOI structure when the ion dose was set at $3.5 \times 10^{17}$ ions/cm$^2$ or lower. FIGS. 5A–5C are schematic illustrations showing this problem. $O^+$ ions, which had been implanted in an Si substrate 210, appeared at a disruption peak position 230 and a concentration peak position 220 (FIG. 5A) to form oxide islets 240 and crystal defects 250 (FIG. 5B), as in the case of the $4 \times 10^{17}$ ions/cm$^2$ dose. Upon disappearance of the oxide islets formed at the disruption peak, some of the oxygen however diffused out from a surface and was hence lost. As a result, oxygen no longer existed at a sufficient concentration in the Si substrate. As is illustrated in FIG. 5C, only grown oxide islets 260 were formed and no embedded continuous oxide film was formed, and no SOI structure was obtained.

In the case of the $O_2^+$ ion implantation, on the other hand, a disruption peak position was extremely close to a concentration peak position and, moreover, existed at a position deep from a surface. The above-mentioned outward diffusion of oxygen therefore did not take place so that despite the same total oxygen dose, a good SOI structure was obtained as in FIG. 1C.

The above results mean that $O_2^+$ ion implantation requires a smaller oxygen dose for the formation of an SOI structure than $O^+$ ion implantation. This indicates that $O_2^+$ ion implantation is effective for shortening an ion implantation time, in other words, for reducing the production cost of SOI substrates. Even if this effect is not taken into consideration, it is evident that, when $O_2^+$ ions are implanted with the same ion current as $O^+$ ions, oxygen can be introduced to a given dose in Si crystals in half the time that is required for $O^+$ ion implantation to achieve the same dose. The above-described effect can therefore bring about an additional effect in that the time of ion implantation can be shortened.

EXAMPLE 4

As in Example 1 to Example 3, four 6-inch p-type Si(100) substrates of 1 to 10 Ω cm were provided. In two of the substrates, $O_2^+$ ions were implanted to $1\times10^{17}$ ions/cm$^2$ and $1.5\times10^{17}$ ions/cm$^2$, respectively, with acceleration energy of 360 KeV. In the remaining two substrates, $O^+$ ions were implanted to $2\times10^{17}$ ions/cm$^2$ $3\times10^{17}$ ions/cm$^2$, respectively, with acceleration energy of 180 KeV. In an atmosphere which contained 0.5% of $O_2$ in Ar, all the substrates were subjected first to heat treatment at 750° C. for 16 hours and then to heat treatment at 1,340° C. for 5 hours.

The application of heat treatment at a low temperature prior to the heat treatment at an elevated temperature of 1,200° C. or higher is an effective means for the promotion of the formation of oxide islets in Si crystals. This provisional heat treatment permits effective utilization of smaller oxide islets compared with the single heat treatment at 1,200° C. or higher.

The promotion of the formation of oxide islets by the low-temperature heat treatment also has some effect for the conventional $O^+$ implantation. When the same low-temperature treatment conditions were set, it was possible to form an SOI structure at a dose of $3\times10^{17}$ ions/cm$^2$. However, when the dose was lowered to $2\times10^{17}$ ions/cm$^2$ under the same low-temperature treatment conditions, a structure similar to that described above with reference to FIG. 5C, namely, an embedded continuous oxide film was not formed, resulting in the provision of a structure with only grown oxide islets 260 formed therein. In the case of the $O_2^+$ ion implantation, on the other hand, it was possible to obtain an SOI structure under the above-described low-temperature treatment conditions at each of the doses of $1\times10^{17}$ ions/cm$^2$ and $1.5\times10^{17}$ ions/cm$^2$.

This difference can be attributed to the fact that the oxide islet forming effect is of substantially the same degree at both the position of a disruption peak and the position of a concentration peak in the case of $O^+$ ion implantation while the oxide islet forming effect is enhanced further in the case of $O_2^+$ ion implantation for the closeness between the position of a disruption peak and the position of a concentration peak.

I claim:

1. A process for the production of an SOI (Si on Insulator) substrate, including a step of forming an buried silicon oxide layer by oxygen ion implantation, which comprises the following steps:

implanting $O_2^+$ ions in a silicon substrate; and subjecting the thus-implanted silicon substrate to heat treatment at a temperature of from 1,200° C. to 1,410° C., both inclusive, in an atmosphere having an oxygen content of from 0.1% to 1%, both inclusive.

2. The process of claim 1, wherein subsequent to said heat treatment, said silicon substrate is further subjected to post heat treatment at a temperature of from 1,200° C. to 1,410° C., both inclusive, in an atmosphere having an oxygen content of from 1% to 30%, both inclusive.

3. The process of claim 1, wherein prior to the heat treatment, said silicon substrate is subjected to provisional heat treatment at a temperature of from 350° C. to 1,000° C., both inclusive, for at least one hour.

* * * * *